United States Patent
Mühe

(10) Patent No.: US 7,125,452 B2
(45) Date of Patent: Oct. 24, 2006

(54) PROCESS FOR CALIBRATING THE TEMPERATURE CONTROL UNIT OF AN OVEN AND OVEN FOR CARRYING OUT THIS PROCESS

(75) Inventor: Andreas Mühe, Hanau (DE)

(73) Assignee: Crystal Growing Systems GmbH, Hanau (DE), .

( * ) Notice: Subject to any disclaimer, the term of this patent is extended or adjusted under 35 U.S.C. 154(b) by 120 days.

(21) Appl. No.: 10/631,571

(22) Filed: Jul. 30, 2003

(65) Prior Publication Data
US 2005/0076827 A1 Apr. 14, 2005

(30) Foreign Application Priority Data
Oct. 5, 2002 (DE) ................ 102 46 567

(51) Int. Cl.
*C30B 11/00* (2006.01)
(52) U.S. Cl. .............. 117/81; 117/82; 117/83; 117/200; 117/201; 117/202
(58) Field of Classification Search ............ 117/81, 117/82, 83, 200, 201, 202
See application file for complete search history.

(56) References Cited

U.S. PATENT DOCUMENTS

| | | | | |
|---|---|---|---|---|
| 5,061,663 A | * | 10/1991 | Bolt et al. .......... | 501/95.1 |
| 5,611,856 A | * | 3/1997 | Schunemann et al. ........ | 117/37 |
| 5,685,907 A | * | 11/1997 | Fujikawa et al. ........... | 117/205 |
| 5,984,524 A | * | 11/1999 | Teshirogi et al. ............ | 374/55 |
| 6,139,627 A | * | 10/2000 | Duval et al. .................. | 117/81 |
| 6,334,897 B1 | * | 1/2002 | Asahi et al. .................. | 117/81 |

FOREIGN PATENT DOCUMENTS

DE 196 22 659 C2 9/1998

* cited by examiner

*Primary Examiner*—Joseph S. Del Sole
*Assistant Examiner*—Matthew Song
(74) *Attorney, Agent, or Firm*—Needle & Rosenberg, P.C.

(57) ABSTRACT

A process for calibrating the temperature control unit of a vertical gradient freeze crystal growth oven, instead of the fused material a test body (3) is used in the oven (1) that does not melt at the oven temperature, that has a heat conductivity comparable to the fused material and a central bore (4). After turning on the resistance heaters (8, 9, 10) of the oven (1) the temperature at the level of the individual control temperature indicators (11, 12, 13) of the oven (1) is measured via a reference temperature indicator (5) that can be fully inserted into the bore (4) and subsequently the output of the respective resistance heaters (8, 9, 10) is set to a desired temperature value. After removing the test body (3) and the reference temperature indicator (5), the oven (1) is operated according to the control temperature indicators (11, 12, 13) taking into consideration previously determined differences between the reference temperatures and the temperature values of the control temperature indicators (11, 12, 13).

4 Claims, 1 Drawing Sheet

Figure 1:
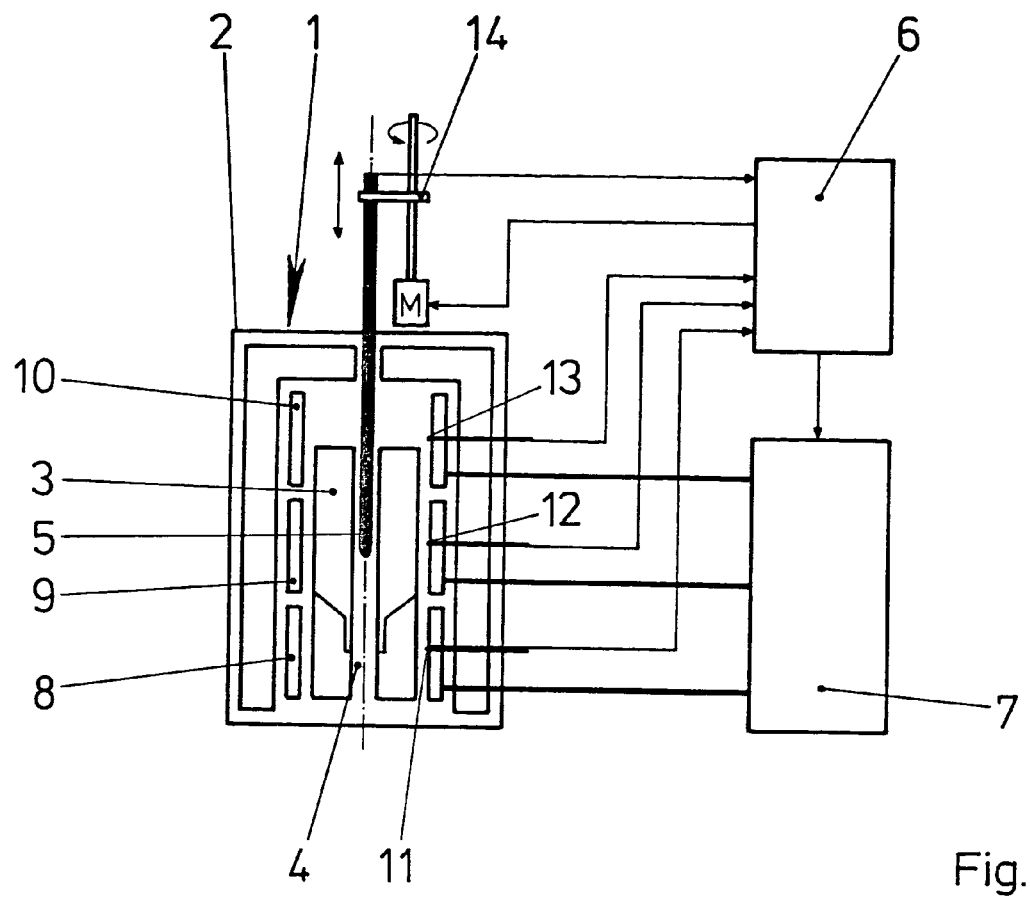

PROCESS FOR CALIBRATING THE TEMPERATURE CONTROL UNIT OF AN OVEN AND OVEN FOR CARRYING OUT THIS PROCESS

CROSS REFERENCE TO RELATED APPLICATION

The present application claims priority to German Patent Application No. 10246567.3, filed Oct. 5, 2002, which application is incorporated herein fully by this reference.

The invention concerns a process for calibrating the temperature control unit of an oven producing a fused material, in particular of a vertical gradient freeze crystal growth oven in which a crucible is surrounded by resistance heaters operating stacked one on top of the other or separately and in which at least one control temperature indicator is provided for each individual resistance heater that controls the heat output of each resistance heater. The invention also concerns an oven with at least two stacked resistance heaters and consequently with at least two control temperature indicators installed at different heights, and a control unit to control the heat output of the resistance heaters depending on the temperature readings given by the control temperature indicators.

Ovens of the above type are above all in use for growing crystals, mostly semiconductor crystals from connecting semiconductors such as GaAs or InP following the vertical gradient freeze process. In the process the semiconductor material to be crystallized is fused on in a crucible made from a high temperature-resistant material such as pyrolytic boron nitride (pBN), in which a vertical temperature gradient with a temperature decreasing from top to bottom ensures that a small, one-crystalline crystal nucleus is not fused into but only on the bottom of the crucible, primarily in a nucleus canal provided for the purpose. In general the temperature distribution in the core zone of the oven is set in a way that the isotherm of the fusion temperature of the material to be grown crosses the area of the crucible horizontally. The phase interface between the crystalline material and the fused material existing on top of it is determined by this isotherm. A directional hardening of the semiconductor material occurs during the subsequent slow cooling of the entire oven, associated with a shift of the vertical temperature profile toward the top, whereby the contact with the single-crystal crystal nucleus initiates an equally single-crystal growth during the hardening of the entire charge.

The crystal-growth ovens used for this process have at least two stacked resistance heaters and consequently at least two control temperature indicators installed at different heights as well as a control unit to control the heat output of the resistance heaters depending on the temperature readings given by the control temperature indicators. Since in growing crystals following the vertical gradient freeze process both the fused material and the growing crystal are inside the crucible of the oven, a visual observation of the phase interface position during the growth of the crystal is not possible. The consequences for controlling the crystallization process are that the progress of the crystal growth can only be gauged from the temperatures determined by way of the control temperature indicators. Should these temperature readings be faulty, the phase interface position and the hardening velocity derived from these values will also be faulty. What is of utmost importance for the industrial production of connecting semiconductor crystals following the vertical gradient freeze process is the reproducibility of a certain growth process as defined via the temperature-time programs of the heating zones. For example the growth of GaAs with a melting temperature of about 1,238° C. in a temperature gradient of 2K/cm and an inaccuracy in the temperature reading of 1% can lead to an inaccuracy in the phase interface position of about 6 cm, rendering a guaranteed germination impossible.

Unfortunately, with the increased use of such ovens the inaccuracies of the control temperature indicators also increase. This is above all due to the fact that impurities from the gas phase intrude in the control temperature indicators usually configured as thermoelements, with the result that the control temperature indicators over time wind up showing lower temperatures than the actual ones. Another reason for mistakes in determining the temperature may be the imprecise positioning of a control temperature indicator during reinstallation after the oven has been taken apart for maintenance purposes. These sources of errors in the temperature readings lead to a creeping or sudden deviation of the actual temperature distribution in the oven from the temperature distribution that is optimal for the process and thereby limit the reproducibility of the processes and the yield of high-quality semiconductor material.

The subject invention addresses the problem of developing a process of the type mentioned above in which measuring errors of the individual control temperature indicators can be easily compensated, resulting in always identical and therefore reproducible processes in spite of faulty temperature readings. The further purpose is to develop an oven suitable for implementing this process.

The invention solves the first problem by measuring, after turning on the resistance heaters, the temperature at the level of the individual control temperature indicators of the oven via a reference temperature indicator that can be fully inserted in the oven during the calibration process, and by first setting the output of the respective resistance heater to the desired temperature via the reference temperature indicator in such a way as to thereby determine the difference from the temperature of the respective control temperature indicator, and, after the removal of the reference temperature indicator, terminate the calibration process by comparing the temperature differences between the reference temperature indicator and the control temperature indicators and the desired temperature differences specified for the oven and the respective calculation of corrective offsets for the control temperature indicators, and that the oven subsequently is operated according to the control temperature indicators taking into consideration the corrective offsets determined during calibration.

This process makes it, for example, possible in a brand-new, still unused oven to set the oven temperature for the individual resistance heaters in the individual zones to the desired values with the control temperature indicators that are intended for the purpose and are thus still new. At the same time the temperature for the individual resistance heaters existing at the level of the respective control temperature indicators can also be determined with the reference temperature indicator and the differences determined in this way can be stored. The one-time storage of the oven-specific temperature differences between control and reference temperature indicators determines the initial position of the programming for all growth processes. During the subsequent operation of the oven the measuring accuracy of the control temperature indicators declines for the reasons explained above, while the reference temperature indicator maintains its accuracy or can be replaced easily with a new, accurate reference temperature indicator. This makes it possible to calibrate the oven from time to time by firing it up for the individual heat zones until the reference temperature indicator indicates the respective original temperature and thereby determines the temperatures of the control temperature indicators measured at that time. The temperature differences measured thereby in the used oven are adjusted to the control temperature indicators with the introduction of the corrective offset in such a way that they equal the temperature differences originally stored for the new oven. The use of the corrective offsets determined in this way for successive growths ensures that the thermal conditions to which the process programs refer are also reproduced accurately in the used oven. The process according to the invention has the fundamental advantage that it compensates not only for errors in the temperature reading of the control temperature indicators but also for changes in the resistance heaters because they are fired up to such a level until the reference temperature indicator shows the correct temperature.

The invention is subsequently described for a vertical gradient freeze crystal growth oven, for which it is particularly suitable. However, in principle it may be used for calibrating control temperature indicators of any temperature-controlled one or multiple-zone oven in which the control temperature indicators are exposed to drift because of ambient conditions or in which a precise reproduction of the thermal conditions is required after a reinstallation or a replacement of the control temperature indicators. However, a high accuracy in the reproduction of a temperature distribution in the parts-per-thousand range is primarily required only in the area of crystal growth and particularly for processes without the possibility of visual control.

It is especially advantageous if instead of the fused material a test body is used for the calibration that does not melt at the oven temperature, that has a comparable heat conductivity as the fused material, a central bore and a geometry that approximates that of the crystal to be grown and has an axial bore for inserting the reference temperature indicator. In this way during calibration with the control temperature indicators similar temperatures are measured as occur during growth in the area of the crystals, and because the inside of the bore approximates the conditions of a black body, with the result that for example changes in the surface of the reference temperature indicator do not result in false readings when measuring the temperature.

It is particularly advantageous if a test body of graphite is used for the calibration process.

For industrial production it is advantageous if the temperature differences between the values of the reference temperature indicator and the control temperature indicator are determined automatically at specified intervals of oven use and if the temperature control is adjusted accordingly.

It is advantageous for determining the need for a calibration process if after reaching a specified set of control temperatures in the control temperature indicators the axial temperature profile is first determined and recorded using the reference temperature indicator and if subsequently the sum of the squares of the differences between the measured temperature profile and the stored reference temperature profile is analyzed in a discrete number of vertical positions.

The second problem, namely the design of an oven for implementing this process, is solved according to the invention by providing the oven with a height-scalable central reference temperature indicator for calibrating the temperature control unit that is scalable to the height of the respective control temperature indicators, that can be used temporarily and alternatively to the control temperature indicators built into the oven for regulating the heat output of individual heat zones, and by making the control unit suitable for storing the reference temperature profiles determined via the reference temperature indicator and the respective control temperature indicators. In such an oven errors in temperature readings by the control temperature indicators can be compensated easily through a calibration process, making the growth processes to be carried out with the oven very reproducible.

It is beneficial if a test body with a central bore for inserting the reference temperature indicator is provided in the oven for calibration purposes. In this way similar temperatures are measured with the control temperature indicators during the calibration process as occur during the growth in the area of the crystal, and because the inside of the bore approximates the conditions of a black body in such a way that for example changes in the surface of the reference temperature indicator do not result in false readings when the temperature is measured.

The invention allows for several embodiments. In what follows reference is made to the drawings in order to better explain the basic principle, showing FIG. 1 a schematic cross section of an oven according to the invention, FIG. 2 the temperature level in the oven.

FIG. 1 shows an oven 1 configured as a vertical gradient freeze crystal growth oven. It has a kettle 2 in which instead of a crucible, not shown, a test body 3 made of graphite is used. The test body 3 could however also be inserted in the crucible. The test body 3 has an end-to-end bore 4 into which a height-scalable reference temperature indicator 5 is inserted that in turn is connected to a control unit 6. This control unit 6 controls an electrical power unit 7 that supplies electrical power to the resistance heaters 8, 9 and 10 stacked one on top of the other in the oven 1. At mid-height of the resistance heaters 8, 9 and 10 a control temperature indicator 11, 12 and 13 configured as a control thermoelement is installed, each of which being connected with the control unit 6. Via a linear drive 14, controlled automatically by the control unit 6, the reference temperature indicator 5 can be turned on, measuring the respective temperatures within the test body 3 at the level of the respective control temperature indicators 11, 12 and 13. The reference temperature indicator 5 therefore makes it possible to automatically determine a temperature profile along the oven axis.

If the oven shown is a conventional vertical gradient freeze crystal growth oven, the temperatures of all resistance heaters 8, 9 and 10 are controlled independently. For this purpose the thermoelectric voltages of the control temperature indicators 8, 9 and 10 configured as thermoelements are collected in the control unit 6 and the control levels of the individual heat outputs are calculated. Subsequently the control unit 6 specifies the desired values for the heat output that are provided by the electrical output unit 7. During the process at each point in time of the growth the desired values for the temperatures of the individual resistance heaters 8, 9 and 10 are taken over from a process program calculated in advance.

Figure 2:
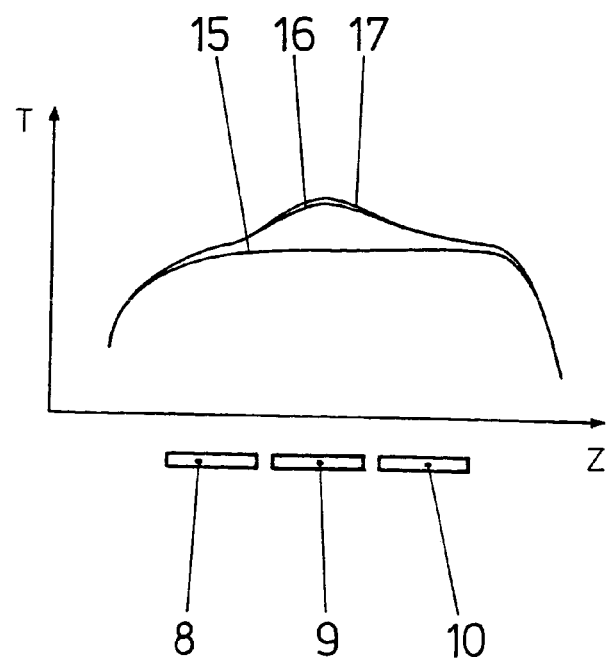

The process according to the invention is based on a reference temperature profile 15 shown in FIG. 2 that is recorded once for each oven type and that shows up at the control temperature indicators 11, 12 and 13 in the oven 1 equipped with the test body 3 at a specifically defined set of control temperatures. FIG. 2 therefore shows the temperature T over a vertical axis Z of oven 1. For clarity's sake the vertical positions of the resistance heaters 8, 9 and 10 are also shown in FIG. 2. The temperatures in the control temperature indicators 11, 12 and 13 should preferably be chosen in such a way that the resulting reference temperature profile approximates the temperature profile in oven 1 during the germination in the actual crystal growth.

Before the beginning of the calibration process and after reaching the specified set of control temperatures in the control temperature indicators 11, 12 and 13, an axial temperature profile can first be determined and recorded via the reference temperature indicator 5, and then the sum of the squares of the differences between the measured temperature profile and the stored reference temperature profile 15 can be used in a discrete number of vertical positions as a criteria as to whether a calibration of the oven is necessary at all. For the actual calibration process, for example, the desired temperature for the control temperature indicator 12 is now increased to a previously specified value $T^{21}_R$ while the temperature values for both other control temperature indicators 11 and 13 are maintained. This results in a new temperature profile 16.

Also, a temperature $T^{21}_S$ in the reference temperature indicator 5 in the also pre-specified position $z^{11}$ is needed for this new configuration of desired temperature values, which was measured and stored under reference conditions. If then during the calibration process the reference temperature indicator 5 is set to position $z^{11}$, the temperature $T^{21}_S{}^{[illegible]}$ measured there can deviate from the temperature $T^{21}_S$ determined under reference conditions precisely when the thermal power of the positioning of the control temperature indicator 12 deviates from the reference conditions. This case is shown in FIG. 2 by a temperature profile 17.

The control of the heat output of the resistance heater 9 is now changed in such as way that it is no longer the control temperature indicator 12 but the reference temperature indicator 5 that is used for the temperature control in order to reach the temperature $T^{21}_S$. If this temperature is preset, a new temperature $T^{21}_R{}^{[illegible]}$ can be measured in the temperature indicator 12 which in turn differs from $T^{21}_R$. The result of the calibration of the control circuit for the resistance heater 9 is then the temperature difference ($T^{21}_R{}^{[illegible]} - T^{21}_R$) that is stored and for future crystal growths must be added as offset to the temperatures measured at the control temperature indicator 12.

After restoring the temperature control of the resistance heater 9 through the control temperature indicator 12 to the desired temperature value before this calibration step, the control circuits for the resistance heaters 8 and 10 can be handled in the same way. As a result of the process, calibration offset for the control temperature indicators 11, 12 and 13 are stored in the control unit 6 of the vertical gradient freeze crystal growth oven, and with their use the axial temperature profile 15 when setting the specified set of control temperatures agrees well with the reference temperature profile recorded under the reference conditions. In order to do justice to the problem of a small mutual influence of the individual control circuits, the calibration process described above can be run several times, if necessary, leading to an iterative reduction in errors in the individual control temperature indicators 11, 12 and 13 and thus to an ever more accurate calibration of the entire oven 1. The above described process for determining the sum of the squares of the differences between the measured temperature profile and the stored reference temperature profile 15 in a discrete number of vertical positions can again be used as criteria for ending the calibration process.

| Reference number listing | |
|---|---|
| 1 | Oven |
| 2 | Kettle |
| 3 | Test bodies |
| 4 | Bore |
| 5 | Reference temperature indicator |
| 6 | Control unit |
| 7 | Output unit |
| 8 | Resistance heater |

| -continued |  |
|---|---|
| Reference number listing | |
| 9 | Resistance heater |
| 10 | Resistance heater |
| 11 | Control temperature indicator |
| 12 | Control temperature indicator |
| 13 | Control temperature indicator |
| 14 | Linear drive |
| 15 | Reference temperature profile |
| 16 | Temperature profile |
| 17 | Temperature profile |

The invention claimed is:

1. Process for calibrating the temperature control unit of an oven producing a fused material, in particular of a vertical gradient freeze crystal growth oven in which a crucible is surrounded by resistance heaters operating stacked one on top of the other or separately and in which at least one control temperature indicator is provided for each individual resistance heater that controls the heat output of each resistance heater, characterized by the fact that the temperature at the level of the individual control temperature indicators of the oven is measured after turning on the resistance heaters via a reference temperature indicator that can be fully inserted in the oven during the calibration process, and first the output of the respective resistance heater is set to a desired temperature as measured by the reference temperature indicator, and by the fact that thereby the difference with the temperature of the respective control temperature indicator is determined, and that after removal of the reference temperature indicator the calibration process is terminated by comparing the temperature differences between the reference temperature indicators and the control temperature indicators and the desired temperature differences specified for the oven and the respective calculation of the corrective offsets for the control temperature indicators, and by the fact that the oven subsequently is operated according to the control temperature indicators taking into consideration the corrective offsets determined during calibration, wherein a test body instead of a fused body is used for the calibration that does not melt at the oven temperature and that has a comparable heat conductivity as the fused material, a central bore and a geometry that approximates that of the crystal to be grown and has an axial bore for inserting the reference temperature indicator.

2. Process according to claim 1, characterized by the fact a test body made of graphite is used for the calibration.

3. Process according to at least one of the preceding claims, characterized by the fact that the calibration process is carried out automatically at specified intervals of oven use and that a new set of corrective offsets is stored for the control temperature indicators.

4. Process according to at least one of the preceding claims, characterized by the fact that for determining the need for a calibration process after reaching a specified set of control temperatures in the control temperature indicators an axial temperature profile is first determined and recorded using the reference temperature indicator, and subsequently the sum of the squares of the differences between the measured temperature profile and the stored reference temperature profile is analyzed in a discrete number of vertical positions.

* * * * *